United States Patent
Jammy et al.

(10) Patent No.: US 6,222,218 B1
(45) Date of Patent: *Apr. 24, 2001

(54) DRAM TRENCH

(75) Inventors: Rajarao Jammy, Wappingers Falls; Jack A. Mandelman, Stormville; Carl J. Radens, Lagrangeville, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/152,835

(22) Filed: Sep. 14, 1998

(51) Int. Cl.$^7$ .......................... H01L 27/108; H01L 29/76; H01L 29/94; H01L 31/119

(52) U.S. Cl. .......................... 257/301; 257/296; 257/300

(58) Field of Search .................................. 257/296–310; 438/243–253

(56) References Cited

U.S. PATENT DOCUMENTS

| | | |
|---|---|---|
| 4,797,719 | 1/1989 | Ueda . |
| 5,335,138 * | 8/1994 | Sandhu et al. ............ 257/310 |
| 5,360,758 | 11/1994 | Bronner et al. . |
| 5,395,786 | 3/1995 | Hsu et al. . |
| 5,411,911 * | 5/1995 | Ikeda et al. ............ 438/253 |
| 5,442,585 | 8/1995 | Eguchi et al. . |
| 5,449,630 | 9/1995 | Lur et al. . |
| 5,466,636 * | 11/1995 | Cronin et al. ............ 438/392 |
| 5,543,348 | 8/1996 | Hammerl et al. . |
| 5,545,583 | 8/1996 | Lam et al. . |
| 5,576,566 | 11/1996 | Kenney . |
| 5,618,761 | 4/1997 | Eguchi et al. . |
| 5,670,405 * | 9/1997 | Tseng ............ 438/253 |
| 5,719,080 | 2/1998 | Kenney . |
| 5,844,266 * | 12/1998 | Stengl et al. ............ 257/301 |
| 5,867,420 * | 2/1999 | Alsmeier ............ 365/149 |

FOREIGN PATENT DOCUMENTS

| | | |
|---|---|---|
| 0 283 964 A2 | 9/1988 | (EP) . |
| 0 537 791 A1 | 10/1992 | (EP) . |
| 0 740 317 A1 | 10/1996 | (EP) . |

OTHER PUBLICATIONS

"Vertical Dram Cell Structure Using Vertical Transistor in the Trench Capacitor," IBM Technical Disclosure Bulletin, vol. 33, No. 3A, pp. 72–75 (Aug. 1990).

DRAM technology perspective for gigabit era. Kim et al. Mar. 1998 vol. 45 Issue: 3 IEEE.*

* cited by examiner

Primary Examiner—Steven Loke
Assistant Examiner—Cuone Quane Nguyen
(74) Attorney, Agent, or Firm—Scully, Scott, Murphy & Presser; Daryl K. Neff, Esq.

(57) ABSTRACT

The present invention relates to a process of fabricating semiconductor memory structures, particularly deep trench semiconductor memory devices wherein a temperature sensitive high dielectric constant material is incorporated into the storage node of the capacitor. Specifically, the present invention describes a process for forming deep trench storage capacitors after high temperature shallow trench isolation and gate conductor processing. This process allows for the incorporation of a temperature sensitive high dielectric constant material into the capacitor structure without causing decomposition of that material. Furthermore, the process of the present invention limits the extent of the buried-strap outdiffusion, thus improving the electrical characteristics of the array MOSFET.

8 Claims, 10 Drawing Sheets

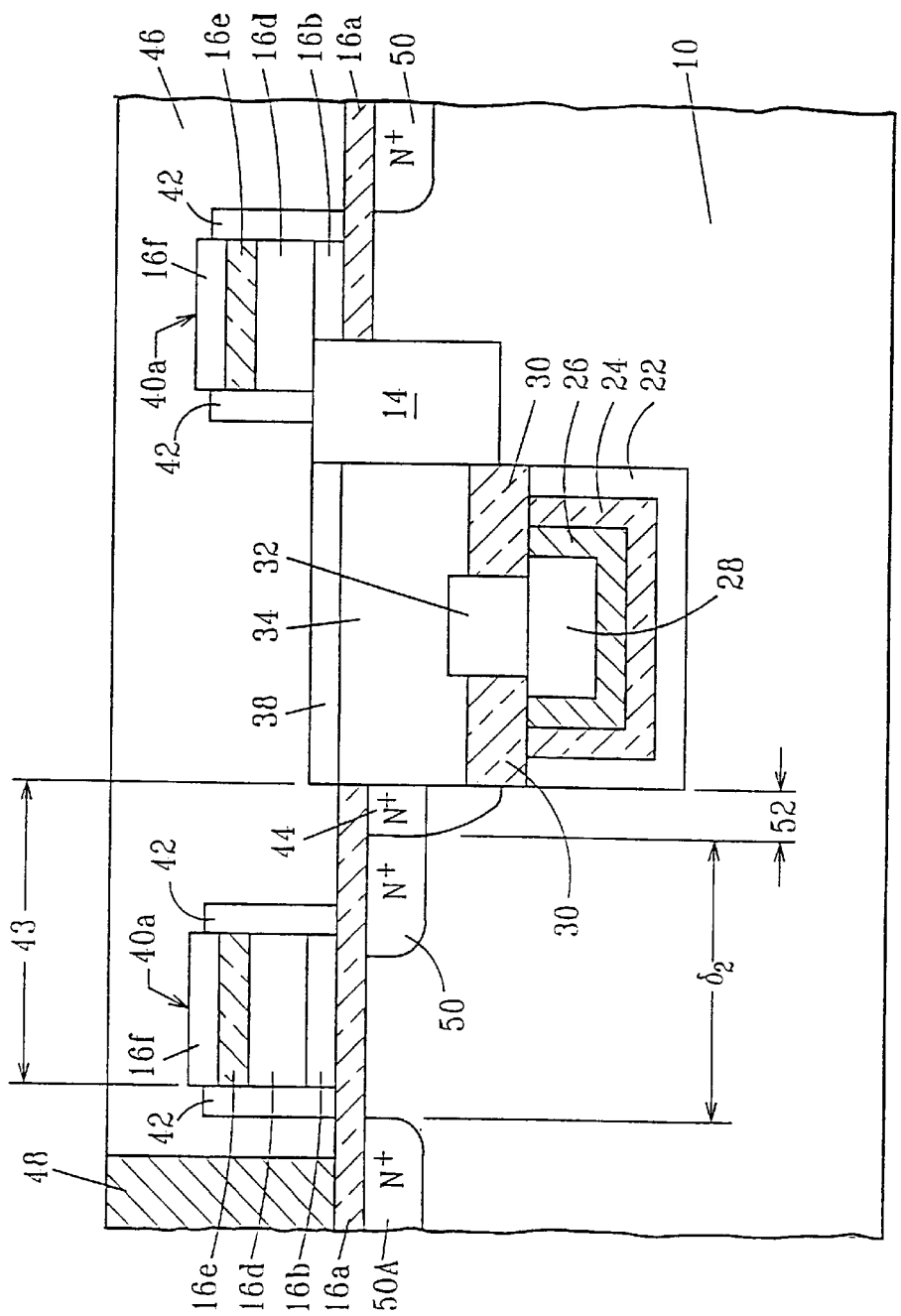
FIG. 3 ($\ell$)

DRAM TRENCH

DESCRIPTION

1. Field of the Invention

The present invention relates to a semiconductor memory device, and in particular to a deep trench dynamic random access memory (DRAM) capacitor structure wherein a temperature sensitive high dielectric constant material is used and is incorporated into the storage node of the DRAM trench capacitor.

2. Background of the Invention

In dynamic random access memory (DRAM) cell manufacturing, a key issue is the size of the overall cell. As the integration densities increase, it is desirable in the semiconductor industry to decrease the storage capacitor size while maintaining the charge storage capacity. One approach to this problem in the prior art is to utilize a deep trench capacitor. Such capacitor structures have reduced surface space while maintaining the charge storage capacity of the capacitor.

One problem associated with the formation of deep trench capacitors for semiconductor memory cells such as DRAMs is how to incorporate temperature sensitive high dielectric constant materials such as barium strontium titanium oxide (BSTO) into the storage node of the DRAM capacitor device.

Another problem associated with the formation of deep trench storage capacitors is the effect of the buried-strap outdiffusion on the array MOSFET electrical characteristics. Presently, DRAM technology falls into two main categories, use of stacked capacitor storage elements and use of deep trench storage capacitors. Each approach has certain advantages and disadvantages relative to each other. For example, deep trench technology results in improved planarization of the various layers of the structure which facilitates the ultra-fine lithographic and etching processes required for todays DRAMs.

FIG. 1 is a cross-sectional diagram showing the structure of a prior art DRAM cell 61 having a trench storage capacitor 60 and an array MOSFET 62. The DRAM cell 61 occupies an area of about $7F^2$ of the surface area of the DRAM IC, F being the minimum feature size which is photolithographically defined for features on the IC. The DRAM cell 61 is characterized by a design dimension 63 which is defined as the lateral distance between the near edge 64 of the trench storage capacitor 60 and the far edge 66 of the gate conductor 68. In an existing $7F^2$ DRAM cell design, this dimension 63 is designed to have a value of nominally 1.5 F, with the width of the gate conductor being 1.0 F and the nominal (designed) distance between the near edge of the gate conductor and the trench storage capacitor 60 being 0.5 F.

The most widely used trench storage DRAM technology utilizes a buried-strap (see FIG. 1) to form the connection between the array MOSFET and the storage capacitor 60. The buried-strap has a diffusion associated with it which extends vertically and laterally away from the interfacial opening between the trench storage capacitor 60 and the silicon substrate (see FIG. 1). The diffusion is formed by the outdiffusion of dopants (i.e. arsenic) from the N+ polysilicon in the storage trench into the adjacent single crystal silicon substrate. The depth and lateral extent of this buried-strap outdiffusion is highly detrimental to the scalability of the array MOSFET.

In past DRAM generations, when the state of the art minimum feature size, F, was larger than approximately 0.5 μm, the presence of the buried-strap outdiffusion did not pose much of an electrical problem for the array MOSFET. However, with present day DRAM designs approaching minimum feature size equal to 0.15 μm, and the typical buried-strap outdiffusion distance being greater than 50 nm from the interface between the N+ polysilicon in the deep trench, it is likely that the buried-strap outdiffused junction may extend under the gate conductor (wordline). This is likely to occur since, in addition to the large outdiffusion relative to the dimension 63, there is significant misalignment tolerance between the gate conductor and the deep storage trench. As shown in FIG. 1, the encroachment of the buried-strap outdiffusion upon the array MOSFET is characterized by the parameter δ, which is the distance between the bitline (BL) diffusion and the buried-strap (BS) outdiffusion, expressed as a percentage of the trench edge to gate conductor edge dimension 63.

FIG. 2 illustrates how the device off-current increases with decreasing δ. To assure that the off-current objective is met under all circumstances, the channel doping of the MOSFET must be raised. However, increased channel doping results in increased junction leakage and degraded device performance, thus degrading data retention time. Therefore, it is highly desirable to make the value of δ as large as possible to minimize these deleterious effects.

The distance between the bitline diffusion and the buried-strap diffusion is determined by the layout groundrules, process tolerances (overlay and feature size) and the amount of buried-strap outdiffusion from the trench storage capacitor. This critical distance is illustrated by the parameter δ in the prior art deep trench DRAM cell shown in FIG. 1. The amount of buried-strap outdiffusion is principally determined by the thermal budget that the buried-strap encounters in the course of the chip fabrication process. The thermal budget is a function of the square root of the sum of the products of the diffusivity, D, of the strap dopant impurity and the effective amount of time spent at each high temperature step which contributes significantly to the diffusion.

For prior art deep trench storage capacitor DRAM cells, the high temperature processing steps which contribute to the strap outdiffusion from the storage capacitor polysilicon typically consist of STI oxidation, STI densification, gate sacrificial oxidation, transfer gate oxidation, gate conductor sidewall oxidation, and junction anneals. The combined thermal budget of these high-temperature processes results in an arsenic outdiffusion from the storage trench poly into the silicon substrate which typically ranges from 50 to 100 nm. This means that for high-density trench DRAM cell designs having a minimum feature size of 0.15 μm, the distance δ typically ranges from 0.08 to 0.13 μm; δ typically ranges from 35% to 60% of the design distance between the storage trench edge and the far edge of the gate conductor, for prior art DRAM cells having a layout area of 7 minimum features squared ($7F^2$) per bit and a minimum feature size, F, equal to 0.15 μm. As seen from FIG. 2, the off-current can vary by more than 100× over this range of variation in δ.

In a possible fabrication approach, a deep trench is first formed in a semiconductor substrate or wafer and then the deep trench is filled with a temperature sensitive high dielectric constant material. After filling the deep trench with the temperature sensitive high dielectric constant material, shallow trench isolation (STI) regions and gate conductor (GC) stacks are typically formed. A problem with such an approach is that the high temperatures used in fabricating the STI regions and the GC stacks adversely affect the temperature sensitive high dielectric constant material used in filling the deep trench and contribute to the buried-strap outdiffusion. Specifically, the length of time at the high processing temperatures employed in fabricating the STI regions and the GC stacks cause decomposition of the temperature sensitive high dielectric constant material and add to the thermal budget of the strap outdiffusion. The high dielectric material and its by-products thus formed may diffuse and interact with the underlying semiconductor material.

To avoid this problem of capacitor insulator degradation, the prior art in stacked capacitor DRAM technology utilizes a thin electrically conductive barrier layer comprising a material such as TiN, TiAlN, TaSiN and CoSi between the temperature sensitive high dielectric constant material and the semiconductor material, e.g. silicon. The presence of such a barrier layer in semiconductor memory devices, while prohibiting oxygen diffusion from occurring, adds additional processing steps and costs to the overall semiconductor memory device manufacturing process.

On top of this conductive barrier layer, the prior art in stacked capacitor DRAM technology typically deposits a thin layer of a conductive material so as to form a bottom electrode. This conducting layer, in the case of high dielectric constant capacitors, is composed of conductive oxides such as $RuO_2$, $SrRuO_3$, La—Sr—Co—O and $IrO_2$, or by metals like Pt or Ir. One advantage of $SrRuO_3$ is that it can be directly deposited on silicon with minimum or no oxidation underneath. A high dielectric constant material can then be deposited on top of the electrode layer to a desired thickness.

Finally, for the top electrodes, material similar to the bottom electrode is typically selected. If it is desired to use a polysilicon or amorphous silicon overlayer, a thin layer of a barrier material, as discussed above, can be deposited to prevent undesirable reactions between silicon and the electrode material before chemical vapor deposition (LPCVD) of amorphous/polysilicon.

In view of the drawbacks mentioned with prior DRAM stacked capacitor structures in using temperature sensitive high dielectric constant material, it would be beneficial if a new and improved process of fabricating a trench DRAM capacitor structure having a temperature sensitive high dielectric constant material incorporated into the storage node of the DRAM capacitor structure was developed which overcomes all of these drawbacks.

It should also be mentioned that in the process embodiment of the present invention, the buried-strap outdiffusion from the trench storage capacitor does not encounter the STI liner oxidation, sacrificial oxidation and gate oxidation steps. This limits the thermal budget and the amount of buried-strap outdiffusion. In prior art processes, the buried-strap diffuses further due to the inclusion of the three oxidation steps mentioned above.

SUMMARY OF THE INVENTION

One object of the present invention is to provide a process of fabricating a trench capacitor semiconductor memory device which allows for the easy incorporation of a temperature sensitive high dielectric constant material into the capacitor region of the device.

Another object of the present invention is to provide a process of fabricating a trench capacitor semiconductor memory device wherein the storage node material, i.e. temperature sensitive high dielectric constant material, does not degrade during the course of providing the STI regions and the GC stack regions of the memory device.

A still further aspect of the present invention is to provide a process of fabricating a trench capacitor semiconductor memory cell device wherein the temperature sensitive high dielectric constant material does not diffuse into the underlying semiconductor material.

Yet another object of the present invention is to provide a process which results in a limited buried-strap outdiffusion, whose deleterious electrical effects on the array MOSFET are reduced from the prior art.

These as well as other objects and advantages can be achieved in the present invention by forming the storage trench after formation of the STI regions in a semiconductor structure which contains preformed layers of a partial GC stack already on the surface of the structure. By fabricating the trench capacitor after STI formation, the temperature sensitive high dielectric constant material does not encounter the high temperatures associated with STI formation. Moreover, since the initial structure contains a partial GC stack already on the surface, the temperature sensitive high dielectric constant material does not encounter high temperatures that are associated with fabricating the GC stack; therefore substantially no degradation of the temperature sensitive material is caused to occur.

Specifically, the process of the present invention comprises the steps of:

(a) providing a semiconductor structure comprising a semiconductor substrate or wafer having at least one trench storage region and a raised shallow trench isolation (STI) region adjacent to said trench storage region, said structure having preformed layers of a partial gate conductor stack formed on said substrate or wafer which are spaced apart by said trench storage region and said raised STI region;

(b) forming a bottom electrode in said trench storage region;

(c) forming a temperature sensitive high dielectric constant material on said bottom electrode and lining sidewalls of said trench storage region;

(d) forming a top electrode over said temperature sensitive high dielectric constant material;

(e) filling said trench with polysilicon;

(f) completing fabrication of a capacitor in said trench storage region;

(g) forming a patterned gate conductor region from said preformed GC stack layers; and (h) forming subsequent device connections so as to complete fabrication of a trench capacitor semiconductor memory cell.

In a highly preferred embodiment of the present invention, the trench storage region is formed after STI formation and formation of the partial GC stack layers. In another highly preferred embodiment of the present invention, a conducting barrier layer is formed over the top electrode prior to the polysilicon fill.

In accordance with the present invention, the formation of the trench storage capacitor follows the formation of the STI. This means that the prior art high-temperature processing steps which include STI oxidation, STI densification, gate sacrificial oxidation, and transfer gate oxidation are not seen by the buried-strap outdiffusion. Elimination of these high temperature steps from the thermal budget of the strap outdiffusion typically results in a reduction of thermal budget of greater than 50%. This reduction of thermal budget translates into a reduction of strap outdiffusion which is typically greater than 30% of the outdiffused distance which results from the prior art process. This reduction in strap outdiffusion, which is typically less than 50 nm, results in a substantial increase in the parameter δ, which results in reduced off-current for a given channel doping concentration. In the present invention δ is always greater than that of the prior art structures. For the inventive structure, δ is typically 50% to greater than 75% of the design distance between the storage trench edge and the far edge of the gate conductor, for a 7F² cell with F=0.15 μm. Because of the high sensitivity of the MOSFET off-current to δ, the inventive structure represents a significant improvement over the prior art, whose δ ranges from 35% to 60% of the design distance.

BRIEF DESCRIPTION OF THE DRAWINGS

FIGS. 3(a)–(l) show various processing steps that are employed in the present invention in fabricating a trench capacitor semiconductor memory device having a temperature sensitive high dielectric constant material incorporated into the storage node of the capacitor.

Detailed Description of the Invention

Figure 1:
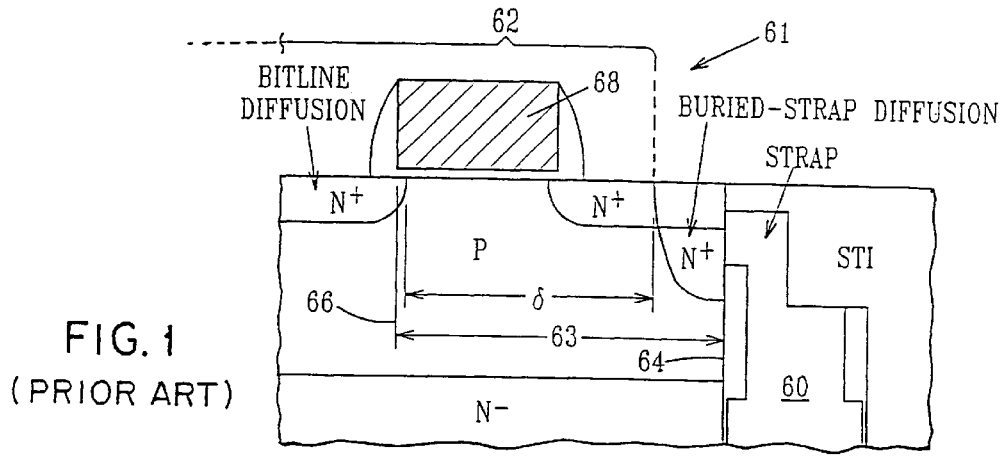
FIG. 1 is a cross-sectional view of a prior art trench storage DRAM structure.
Figure 2:
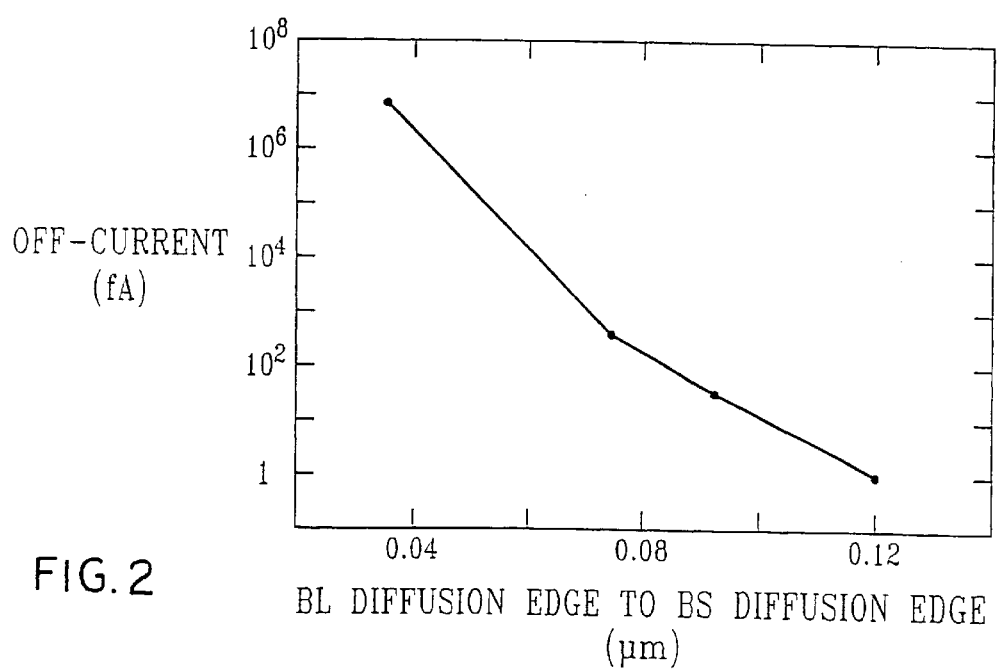
FIG. 2 is a graph of modeled sensitivity of device off-current to distance outdiffusion and bitline diffusion, δ.

The present invention, which provides a process of fabricating a trench capacitor semiconductor memory device having a temperature sensitive high dielectric material incorporated into the storage node of the capacitor, will now be described in greater detail by referring to the drawings that accompany this application. It is noted that in the various drawings like elements or components are referred to by like and corresponding reference numerals.

Before describing the process of the present invention it is again emphasized that the process of the present invention overcomes the drawbacks in prior art deep trench semiconductor memory cells by forming the trench storage region after the STI regions and preformed layers of a GC stack are formed. By forming the storage trench after high temperature STI and GC processing, the temperature sensitive high dielectric constant material formed in the storage trench of the memory cell does not degrade and thus it does not interact by diffusion with the underlying semiconductor material.

Furthermore, in the present invention the buried-strap outdiffusion does not see several high temperature processing steps which contribute to large buried-strap outdiffusion in the prior art. Thus, the lateral outdiffusion of the buried-strap formed in the present invention is significantly reduced as compared with prior art memory cell structures.

Figure 3A:
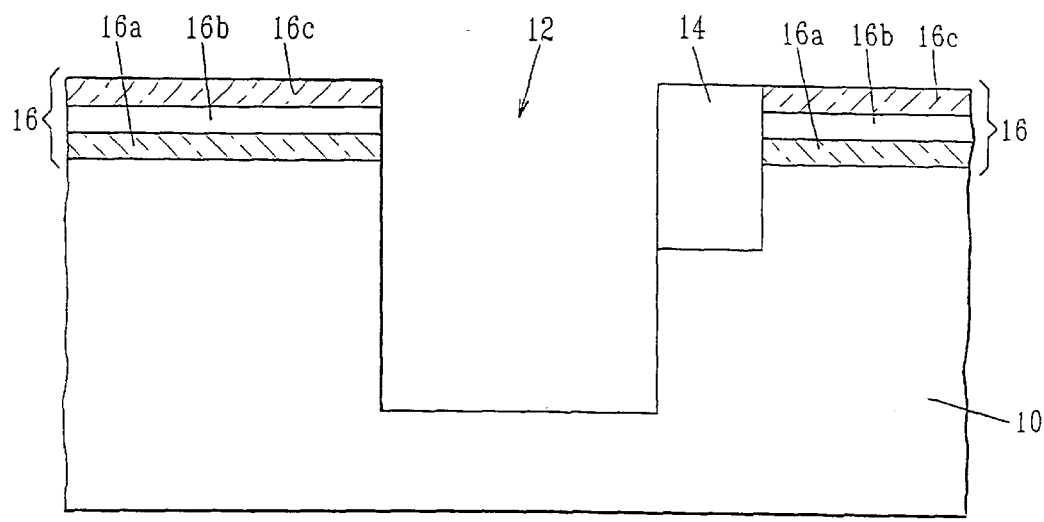

With this in mind, attention is directed to FIG. 3(a) which shows an initial semiconductor structure which is employed in step (a) of the present invention. Specifically, the semiconductor structure shown in FIG. 3(a) comprises a semiconductor substrate or wafer 10 having at least one storage trench region 12 and a raised shallow trench isolation (STI) region 14 adjacent to storage trench region 12 formed therein. The structure further comprises preformed layers 16 of a partial gate conductor stack formed thereon which are spaced apart by storage trench region 12 and raised STI region 14.

Semiconductor substrate or wafer 10 is composed of any semiconducting material including, but not limited to: Si, Ge, SiGe, GaAs, InAs, InP and all other III/V compounds. Of these semiconducting material, it is preferred that semiconductor substrate or wafer 10 be composed of Si. The semiconductor substrate or wafer may be of the p-type or the n-type depending on the type of semiconductor memory device being manufactured.

The preformed layers of the partial gate conductor shown in FIG. 3(a) are composed of a bottom gate oxide layer 16a such as $SiO_2$, a middle layer of polysilicon 16b and a top polish stop layer 16c such as $Si_3N_4$. The layers are formed sequentially on the surface of the semiconductor substrate or wafer starting with layer 16a, then 16b and finally 16c.

Figure 4A:
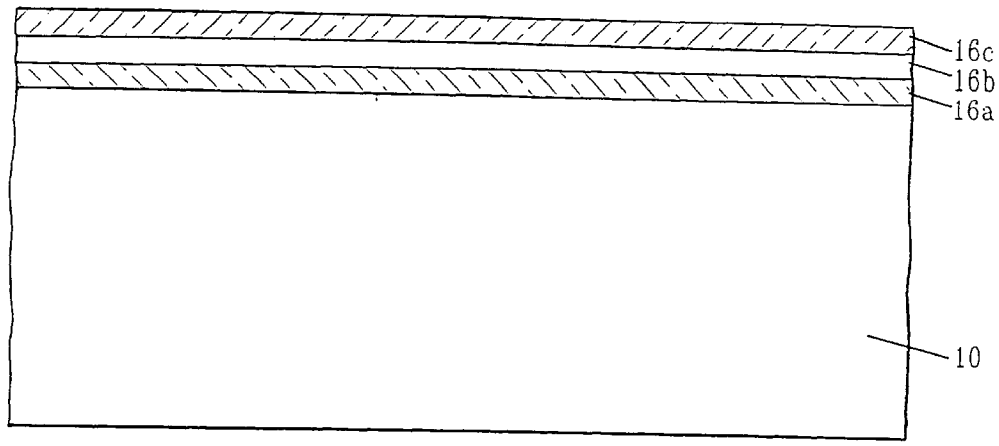
FIGS. 4(a)–(d) show various processing steps that are employed in fabricating the semiconductor structure illustrated in FIG. 3(a).

The structure shown in FIG. 3(a) is fabricated using conventional techniques well known to those skilled in the art. For example, the structure shown in FIG. 3(a) can be fabricated as is shown in FIGS. 4(a)–(d). Specifically, as is shown in FIG. 4(a), a semiconductor substrate or wafer 10 is first provided and gate oxide layer 16a is grown on the surface of semiconductor substrate or wafer 10 using conventional thermal growing techniques well known to those skilled in the art. This includes heating the semiconductor substrate or wafer in an oxygen ambient at a temperature of from about 800° to about 1100° C. until a gate oxide having a thickness of from about 4 to about 10 nm is formed on the surface of the semiconductor substrate or wafer.

Next, a layer of polysilicon 16b is formed on the surface of gate oxide 16a using standard deposition techniques well known to those skilled in the art. Suitable deposition processes that may be employed in forming polysilicon layer 16b include, but are not limited to: chemical vapor deposition, plasma vapor deposition, low pressure chemical vapor deposition, high density chemical vapor deposition and other like deposition processes. The thickness of the polysilicon layer formed is typically in the range of from about 10 to about 500 nm.

Polish stop 16c is then formed on polysilicon layer 16b using standard deposition techniques, including those mentioned above, that are well known to those skilled in the art. The polish stop is composed of a conventional material such as $Si_3N_4$ which resists erosion during subsequent planarization and etching steps. The thickness of the polish stop layer formed is typically of from about 10 to about 500 nm.

Figure 4B:
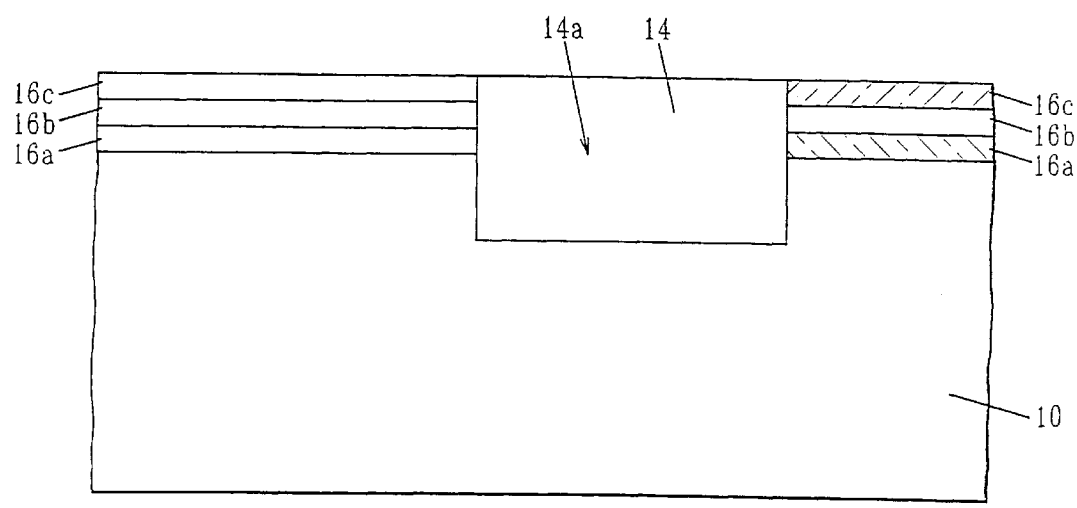

The next step in forming the structure of FIG. 3(a) is illustrated in FIG. 4(b). Specifically, FIG. 4(b) shows a structure which contains a trench 14a which is formed in layers 16a, 16b, and 16c as well as the surface of semiconductor substrate or wafer 10. It is noted that trench 14a is used in forming STI region 14. The structure of FIG. 4(b) is fabricated using standard lithography, etching and planarization, all of which are well known to those skilled in the art.

Specifically, the structure shown in FIG. 4(b) is fabricated by providing a conventional resist having a preformed pattern on top of layer 16c of the structure shown in FIG. 4(a) using standard deposition techniques which include spin-on coating and dip coating. The pattern is then etched by standard etching techniques well known to those skilled in the art through layers 16c, 16b, 16a as well as into semiconductor substrate or wafer 10. Suitable etching techniques that can be employed include, but are not limited to: reactive ion etching (RIE), plasma etching and ion beam etching. The depth that etching is performed into the semiconductor substrate or wafer is typically of from about 100 to about 700 nm. It should be noted that the resist is removed at this time using conventional stripping techniques well known to those skilled in the art.

A thermal silicon dioxide layer, not shown in the drawings, is then grown in the trench of the raised STI region using conventional thermal growing techniques, including the use of an oxygen-containing ambient and heating to a temperature of from about 750° to about 1100° C. The thickness of the grown silicon dioxide layer in trench 14a is typically of from about 3 to about 30 nm. A STI dielectric, not shown in the drawings, is then formed over the thermal silicon dioxide layer using standard deposition techniques such as low pressure chemical vapor deposition or a plasma-assisted process. Suitable STI dielectrics include, but are not limited to: high density plasma tetra-ethylorthosilicate (HDP TEOS) oxide. It should be noted that in the drawings of the present invention, the above two components, i.e. thermal silicon dioxide layer and STI dielectric are not shown. Instead, STI region 14 is meant to include those two components as well as others that may be present in a conventional STI region.

To provide a planar structure, as is shown in FIG. 4(b), the structure is then planarized using standard planarization techniques well known to those skilled in the art, including, but not limited to: chemical mechanical polishing, RIE and grinding.

Figure 4C:
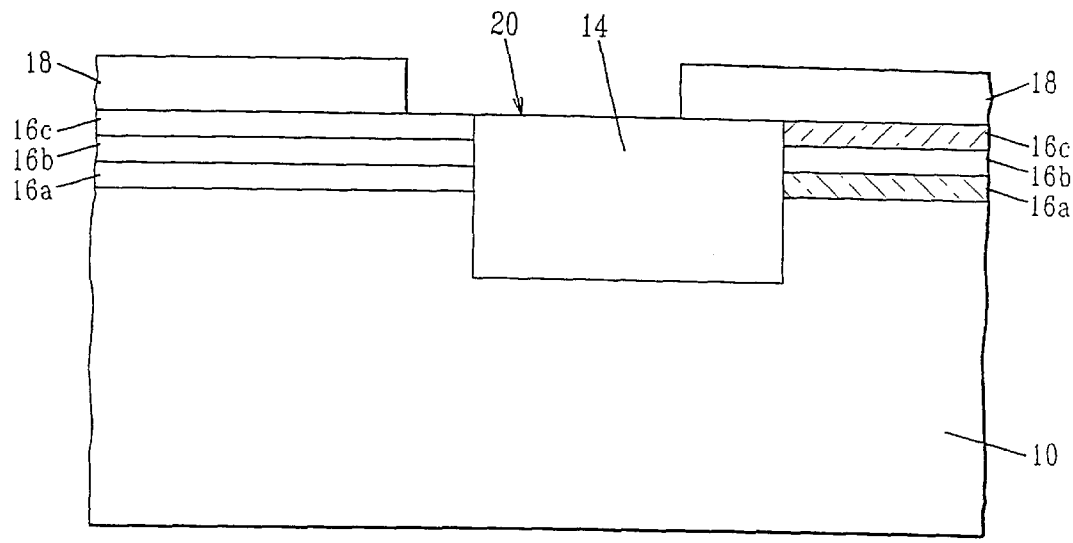

FIG. 4(c) shows the next steps employed in fabricating the structure illustrated in FIG. 3(a). Specifically, to the planarized structure of FIG. 4(b) there is formed a hard dielectric mask layer 18, e.g. boron doped silicon dioxide (BSG), which is then patterned utilizing standard lithography techniques and reactive ion etched to remove a portion of the hard dielectric mask. The patterned structure is shown in FIG. 4(c).

Figure 4D:
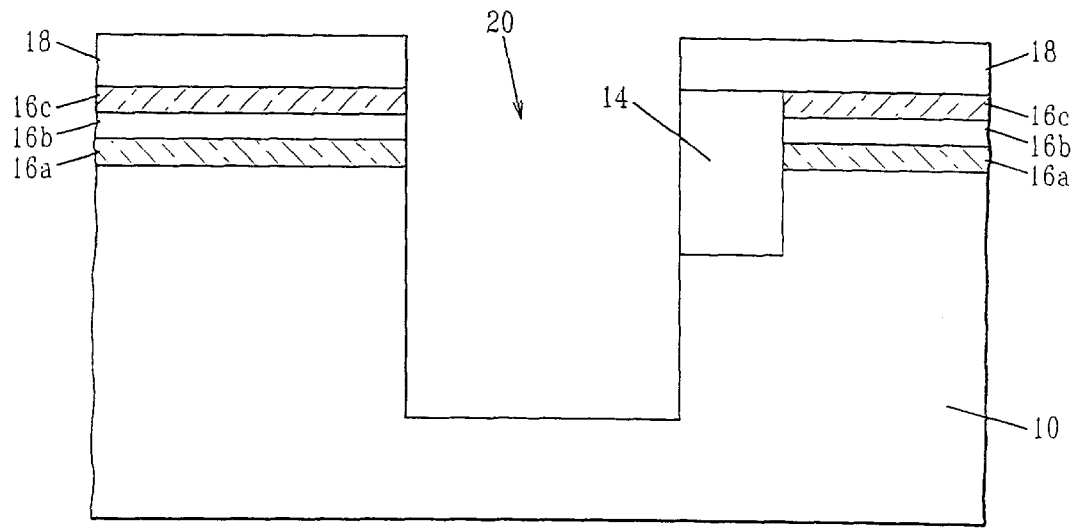

Next, a storage trench 20 is formed in semiconductor substrate or wafer 10 using hard dielectric layer 18 as a masking film. Specifically, RIE using reactive gases such as HBr, $NF_3$, $O_2$ or He is employed in fabricating storage trench 20. By "storage trench" it is meant that etching is performed to a depth of from about 1 to about 10 $\mu$m. The structure containing storage trench 20 which forms the capacitor region of the device is shown in FIG. 4(d). Hard dielectric mask 18 is then removed by an HF-etching process to provide the structure shown in FIG. 3(a).

It is again emphasized that the above description provides one way of fabricating the structure shown in FIG. 3(a). Other ways of fabricating the structure shown in FIG. 3(a) are also known and are thus contemplated herein.

Figure 3B:
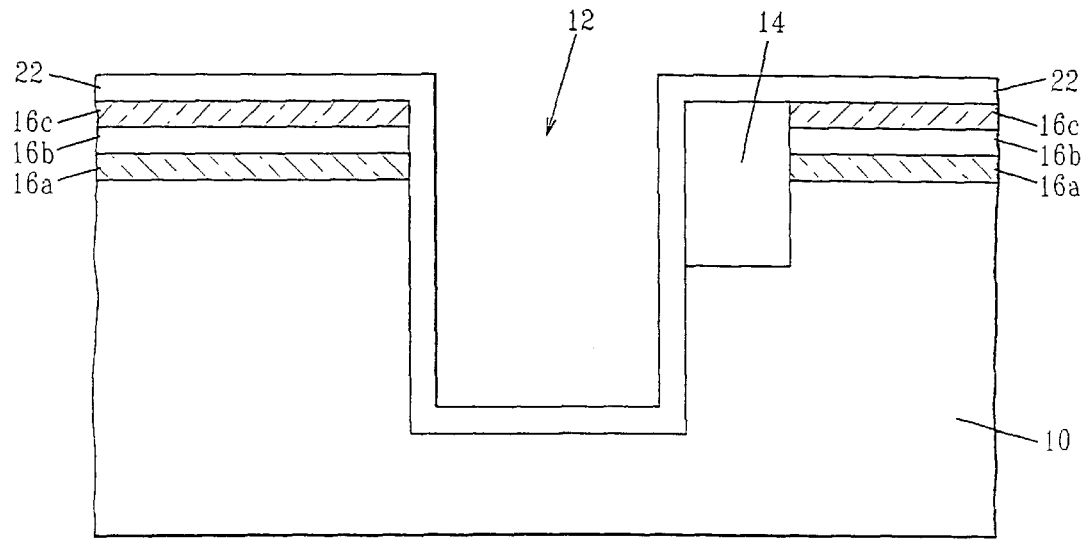

In accordance with step (b) of the present invention, a bottom electrode 22 is then formed in storage trench 20 (bottom wall, sidewalls as well as areas outside the deep trench) using conventional deposition techniques well known to those skilled in the art. For example, bottom electrode 22 can be formed by chemical vapor deposition, metallo-organic chemical vapor deposition, electroplating or electrodeless plating. The material employed in forming bottom electrode 22 includes any conductive oxide which is typically used as a bottom electrode of a capacitor. Exemplary conductive oxides include, but are not limited to: $RuO_2$, $SrRuO_3$, La—Sr—Co—O, $IrO_2$ and other like conductive oxides. In addition to conductive oxides, metals such as Pt or Ir can also be used as the bottom electrode. The structure containing bottom electrode 22 is shown in FIG. 3(b).

In an optional embodiment of the present invention, a diffusion barrier layer is formed in storage trench 20 prior to forming bottom electrode 22. Suitable diffusion barrier layers that can be optionally employed in the present invention include, but are not limited to: TiN, TiAlN, TaSiN, CoSi and other like materials which are capable of preventing the diffusion of oxygen into the semiconductor substrate or wafer. Chemical vapor deposition or physical vapor deposition are two deposition processes that can be employed in the present invention in forming the optional diffusion barrier layer.

Figure 3C:
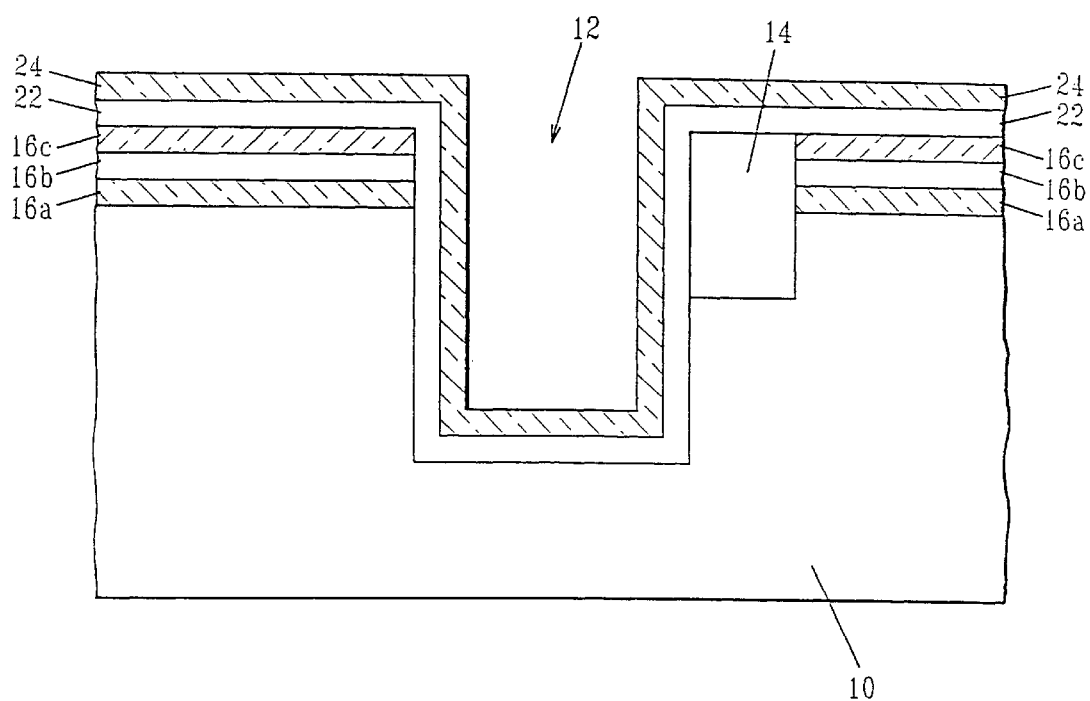

After formation of bottom electrode 22, a layer of a temperature sensitive high dielectric constant material 24 is formed on the surface of the bottom electrode, see FIG. 3(c). The term "temperature sensitive" is used herein to denote a material which when in contact with silicon and heated to temperatures over 600° C. oxidizes the silicon and degrades by reacting with silicon or by breaking up into other compounds. The temperature sensitive high dielectric constant material utilized herein is however not in direct contact with silicon. It nevertheless becomes unstable by itself at temperatures of about 550° C. and above. On the other hand, the term "high dielectric constant material" denotes a material which has a dielectric constant relative to a vacuum higher than about 7. More preferably, the high dielectric constant material employed in the present invention has a dielectric constant of from about 20 to about 10,000.

Suitable temperature sensitive high dielectric constant materials that can be employed in the present invention include perovskite-type oxides such as barium strontium titanium oxide (BSTO), lead zirconium titanium oxide (PZTO), strontium bismuth tantalate (SBT) and $Ta_2O_5$. The temperature sensitive high dielectric constant material is formed on bottom electrode 22 using standard deposition processes including chemical vapor deposition or sputtering.

Figure 3D:
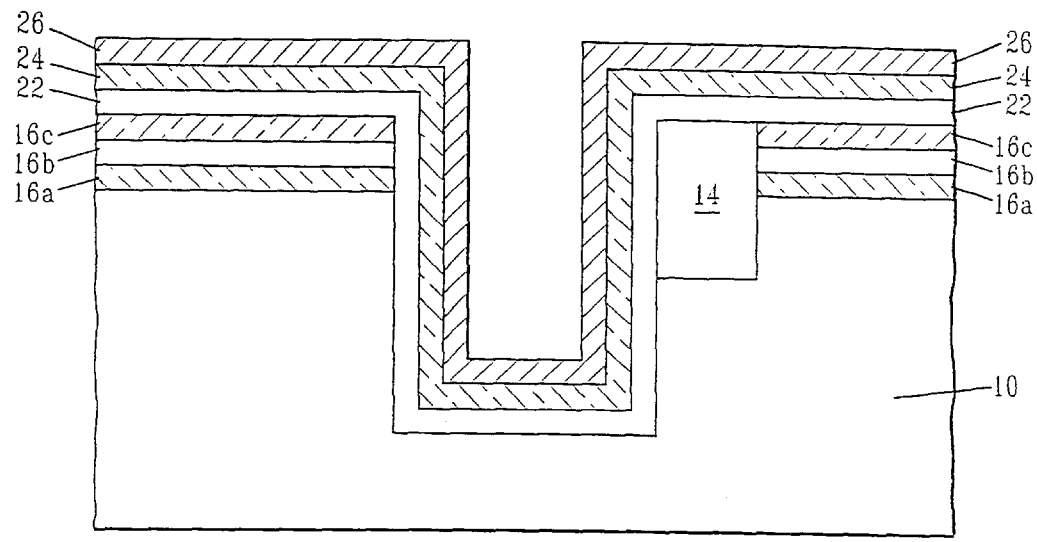

A top electrode 26 is then formed on top of temperature sensitive material 24 utilizing standard deposition techniques such as chemical vapor deposition. The top electrode may be composed of the same or different conductive oxide as the bottom electrode. Thus, top electrode 26 may be composed of $RuO_2$, $SrRuO_3$, La—Sr—Co—O and $IrO_2$. Alternatively, Pt or Ir can be employed. The structure containing top electrode 26 is shown in FIG. 3(d).

In an optional, but highly preferred embodiment of the present invention, a conducting barrier layer is formed over top electrode 26 prior to filling the trench with polysilicon 28. This conducting barrier layer which is formed by conventional deposition processes serves to prevent interaction between the temperature sensitive high dielectric constant material and the polysilicon. TiN, TiAlN, CoSi and TaSiN are some examples of conducting barrier layers that may be employed in the present invention. For clarity, the conducting barrier layer is not shown in the drawings.

Figure 3E:
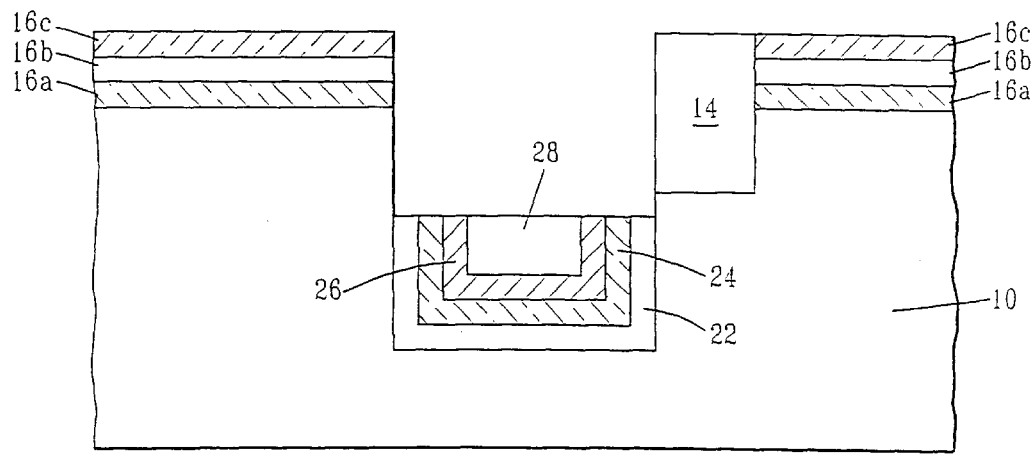

The remaining portion of storage trench 20 is filled with polysilicon 28, preferably n+—doped polysilicon, using standard deposition processes and then the polysilicon is recessed using a dry etch containing gas such as $SF_6$, He, $O_2$ or $NF_3$ to a depth of from about 0.5 to about 1.5 $\mu$m. The structure obtained from these combined steps of the present invention is shown in FIG. 3(e).

It should be noted that the recess process mentioned above and the description that follows regarding FIGS. 3(f)–(j) refers to processing steps that are employed in the present invention in fabricating the capacitor in the storage trench region.

Figure 3F:
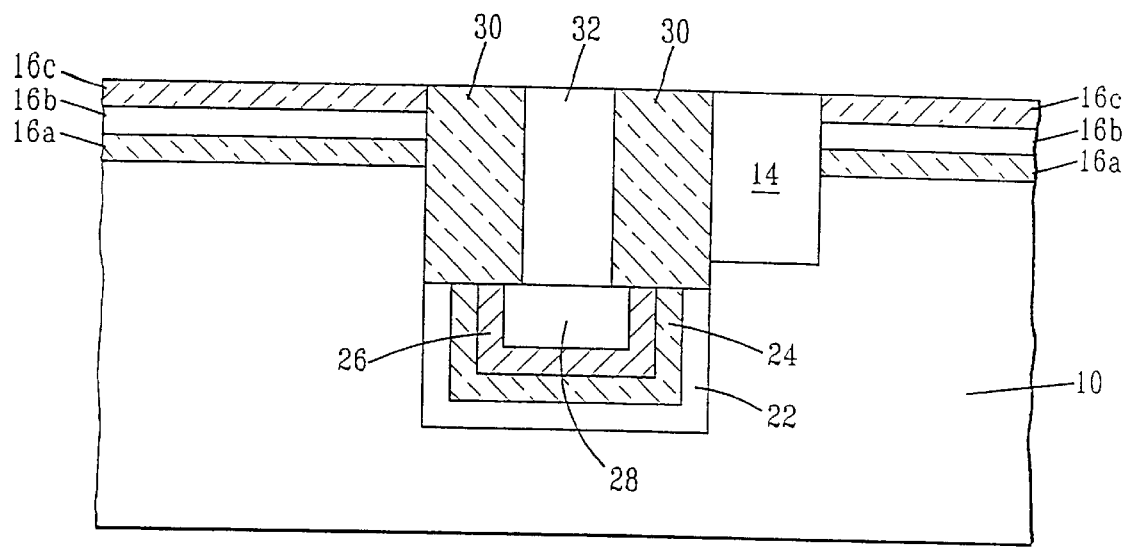

Next, as is shown in FIG. 3(f), a conformal insulating collar oxide 30 is then formed over the semiconductor substrate or wafer 10 and the sidewalls of storage trench 20 which were again left exposed by the above recess process. The conformal insulating collar oxide is formed by conventional deposition processes such as low pressure chemical vapor deposition or plasma-assisted chemical vapor deposition to a thickness of from about 10 to about 30% of the storage trench diameter. Dry etching using an anisotropic removal processing gas such as $C_4F_8$, $CH_3F$, $CF_4$, $C_3F_8$, CO, $O_2$ or Ar is then employed so as to etch material from the wafer plane and the bottom of storage trench 20, but leaving material along the sidewalls of the storage trench. The trench is then filled with low pressure chemical vapor deposited polysilicon 32 which may or may not be doped and planarized utilizing a dry etch or chemical mechanical polishing process.

Figure 3G:
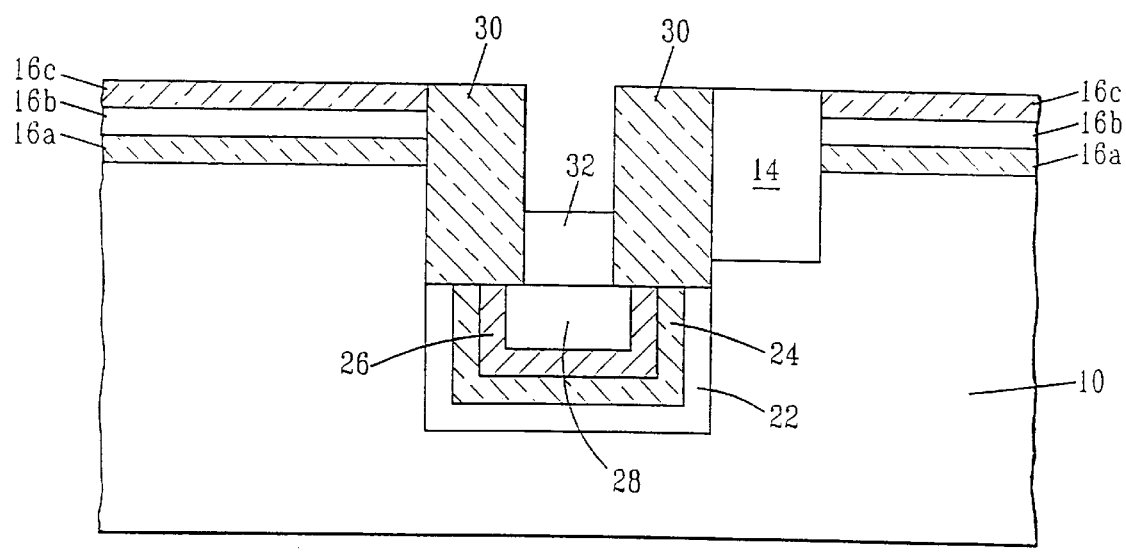
Figure 3H:
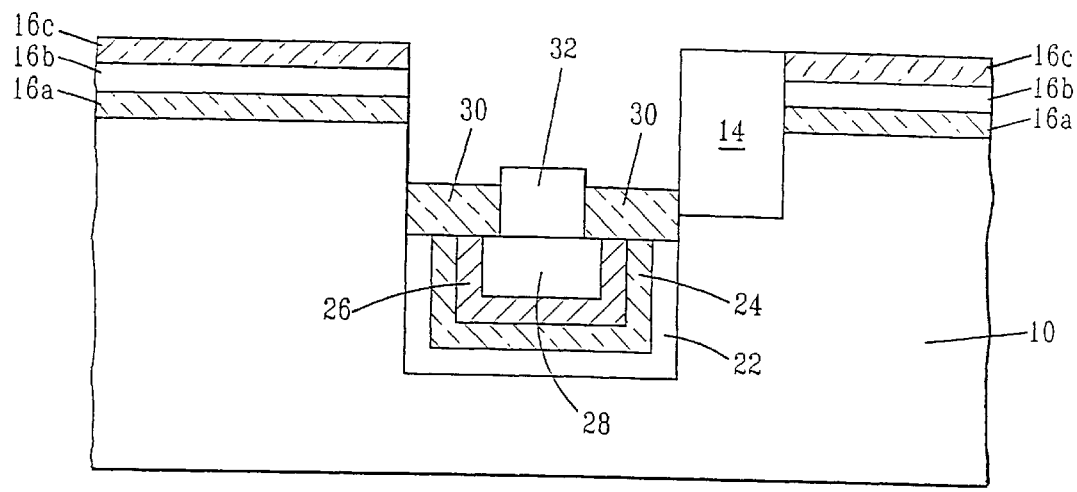

As shown in FIG. 3(g), the low pressure chemical vapor deposited polysilicon is then recessed to a predetermined depth, e.g. 20 to 50 nm, utilizing a dry etch process such as previously described hereinabove. The collar dielectric is then removed using a HF containing etch from upper regions of the storage trench, See FIG. 3(h).

Figure 3I:
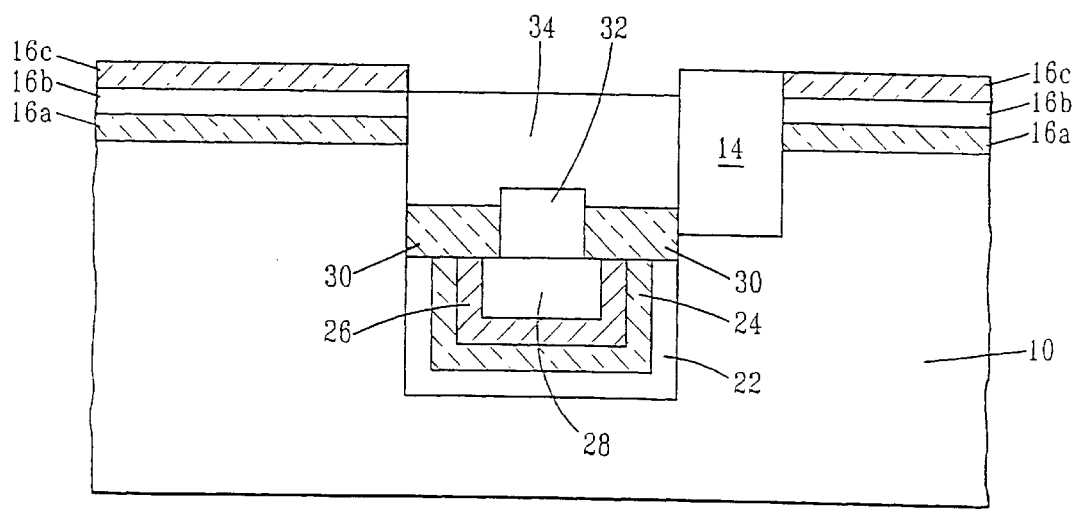

The next steps employed in the present invention in completing the fabrication of the capacitor in the storage trench, which is shown in FIG. 3(i), comprise depositing a low pressure chemical vapor deposition polysilicon layer 34 which may or may not be doped over the structure and then recessing using an anisotropic dry etch process containing gases such as HBr, $Cl_2$, HCl, $SF_6$, He or $O_2$ to a depth of from about 5 to about 30 nm below the surface of semiconductor substrate or wafer 10.

Figure 3J:
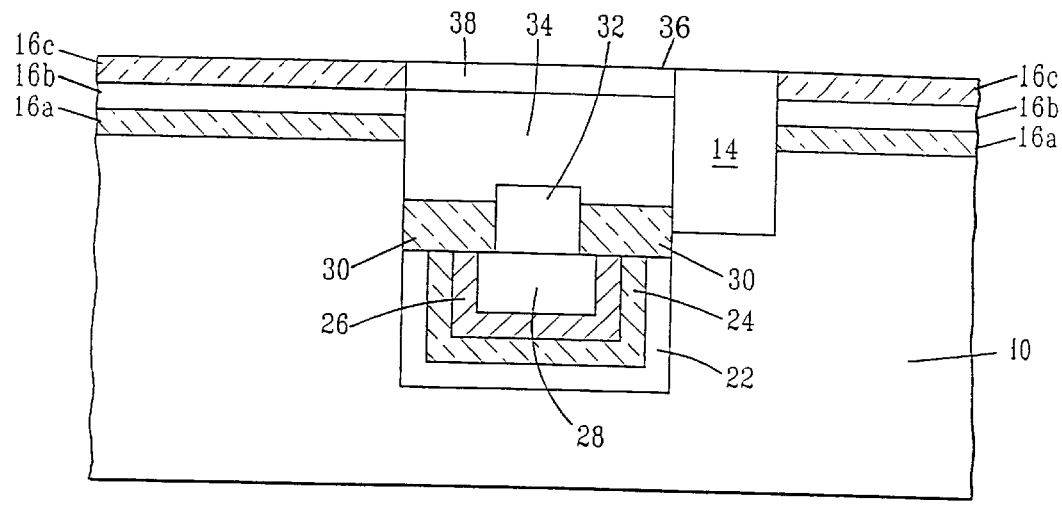

Capacitor 36 is then completely fabricated in the storage trench by forming a trench top oxide (TTO) dielectric film 38 and planarizing to the top of layer 16c, See FIG. 3(j). The TTO dielectric film is formed by conventional deposition processes including low pressure chemical vapor deposition or plasma enhanced chemical vapor deposition and planarization is carried out using one of the previously mentioned planarization techniques, e.g. chemical mechanical polishing.

Figure 3K:
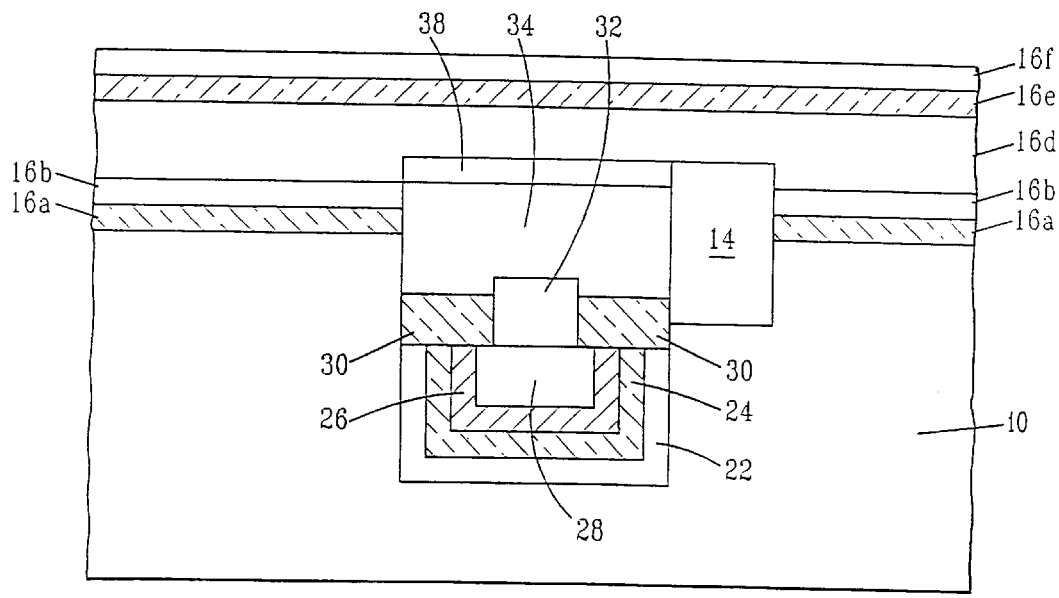

FIG. 3(k) shows a structure which includes a completely formed gate conductor stack which includes preformed gate conductor layers 16a and 16b, as well as a polysilicon layer 16d, a salicide layer, i.e. WSi, 16e and cap layer, $Si_3N_4$, 16f. Polysilicon layer 16d is formed using the same deposition techniques as is described for polysilicon layer 16b. Layer 16e is formed by chemical vapor deposition or sputtering and it has a thickness of from about 20 to about 200 nm. In regard to cap layer 16f, that layer is formed by low pressure chemical vapor deposition and it has a final deposited thickness of from about 20 to about 300 nm. It should be noted that barrier layer 16c is removed prior to depositing layers 16d, e and f.

The various gate stack layers are then patterned using conventional lithography and a RIE dry etch process stopping in gate oxide layer 16a and the TTO/STI oxide, See FIG. 3(l). A gate sidewall oxidation may be done by conventional process. Sidewall spacers 42, e.g. $Si_3N_4$, are formed over the patterned gate conductor stack 40a using deposition techniques well known to those skilled in the art.

The semiconductor memory structure is then fully fabricated as follows: source/drain diffusion regions 50 are formed in the semiconductor substrate or wafer 10 using conventional ion implantation followed by appropriate annealing steps. In FIG. 3(l), 50A represents a bitline diffusion region and the MOSFET region of the memory cell is defined as comprising patterned gate stack region 40a, region 50 and region 50A. The gate sidewall oxidation and junction anneal steps mentioned hereinabove drive the N+ dopant from polysilicon region 28 through polysilicon regions 32 and 34 forming a limited buried-strap outdiffusion region 44. The limited buried-strap outdiffusion region of the present invention has a lateral dimension 52 of less than 50 nm. More preferably the lateral dimension 52 of the buried-strap is from about 15 to about 30 nm.

An insulating layer 46 such as boron-phosphorous doped glass is deposited over the structure covering patterned gate conductor regions 40a, exposed gate oxide region 16a, and capacitor 36 using conventional deposition processes such as spin-on coating and chemical vapor deposition. Insulating layer 46 is then planarized using one of the aforementioned planarization techniques, and borderless diffusion contacts 48 are formed by standard lithography, dry etching, depositing a polysilicon layer and planarization.

It is noted that the memory cell of FIG. 3(l) is unlike prior art memory cells since the lateral outdiffusion of the buried-strap is significantly reduced as compared with prior art structures. Moreover, the distance, $\delta_2$, is greater for the inventive structure as compared with prior art structures, like the type shown in FIG. 1. This greater distance means that the off-current problem typically observed with prior art structures is significantly reduced herein.

In a DRAM cell in which the designed distance 43 between the near edge of the trench capacitor and the far edge of the gate conductor stack 40a is about 1.5 times a minimum feature size F of 0.15 $\mu$m, the distance $\delta_2$ is nominally at least 50% of the distance 43. A distance, $\delta_2$, of nominally 75% or greater can be achieved with the process disclosed herein for a $7F^2$ DRAM cell with F equal to 0.15 $\mu$m.

While the present invention has been particularly shown and described with respect to preferred embodiments thereof, it will be understood by those skilled in the art that the foregoing and other changes in form and detail may be made without departing from the spirit and scope of the present invention.

Having thus described our invention, what we claim as new, and desire to secure by the Letters Patent is:

1. A memory cell comprising
a capacitor formed in a trench located in a semiconductor substrate or wafer, said capacitor including at least a temperature sensitive high dielectric constant material located between a bottom electrode and a top electrode;
a MOSFET formed in said semiconductor substrate or wafer, said MOSFET comprising at least a patterned gate conductor stack, a near source/drain region located between said gate conductor stack and said capacitor, a far source/drain region located on a side of said gate conductor stack opposite said near source/drain region said capacitor and said MOSFET being connected by a buried-strap outdiffusion region laterally extending from an edge of said trench toward said gate conductor stack, said buried-strap outdiffusion region having a lateral outdiffusion of less than 50 nm;
said capacitor and said source/drain regions having lateral dimensions photolithographically patterned to a minimum feature size of about 0.15 micron or smaller; and
said memory cell characterized by a distance parameter, said parameter being the lateral distance between a near edge of said far source/drain region and a near edge of said outdiffusion region, said parameter having a value of between about 50% to greater than 75% of a lateral distance between said far gate conductor edge and said trench edge.

2. The memory cell of claim 1 wherein said lateral outdiffusion is from about 15 to about 30 nm.

3. The memory cell of claim 1 wherein said buried-strap outdiffusion region is positioned adjacent to said capacitor.

4. The memory cell of claim 1 wherein said semiconductor substrate or wafer is composed of Si.

5. The memory cell of claim 1 wherein said temperature sensitive high dielectric material is a material which may become unstable and also oxidize silicon when exposed to temperatures over 550° C. and has a dielectric constant of about 7 or higher.

6. The memory cell of claim 5 wherein said temperature sensitive high dielectric constant material has a dielectric constant of from about 20 to about 10,000.

7. The memory cell of claim 2 wherein said temperature sensitive high dielectric constant material is a material selected from the group consisting of barium strontium titanium oxide (BSTO), lead zirconium titanium oxide (PZTO), strontium bismuth tantalate (SBT) and $Ta_2O_5$.

8. The memory cell of claim 7 wherein said temperature sensitive high dielectric constant material is BSTO.

* * * * *